United States Patent
Hung et al.

(10) Patent No.: US 10,297,638 B1
(45) Date of Patent: May 21, 2019

(54) FLEXIBLE LIGHT SOURCE STRUCTURE AND METHOD FOR MANUFACTURING SAME

(71) Applicant: ADVANCED OPTOELECTRONIC TECHNOLOGY, INC., Hsinchu Hsien (TW)

(72) Inventors: Tzu-Chien Hung, Hsinchu (TW); Ya-Chi Lien, Hsinchu (TW)

(73) Assignee: ADVANCED OPTOELECTRONIC TECHNOLOGY, INC, Hsinchu Hsien (TW)

( * ) Notice: Subject to any disclaimer, the term of this patent is extended or adjusted under 35 U.S.C. 154(b) by 0 days.

(21) Appl. No.: 15/920,596

(22) Filed: Mar. 14, 2018

(30) Foreign Application Priority Data

Jan. 18, 2018 (CN) .......................... 2018 1 0052258

(51) Int. Cl.
| | |
|---|---|
| *H01L 27/15* | (2006.01) |
| *H01L 21/683* | (2006.01) |
| *H01L 33/42* | (2010.01) |
| *H01L 33/62* | (2010.01) |
| *H01L 33/52* | (2010.01) |
| *H01L 51/00* | (2006.01) |
| *G09F 9/30* | (2006.01) |

(52) U.S. Cl.
CPC ........ *H01L 27/156* (2013.01); *H01L 21/6836* (2013.01); *H01L 33/42* (2013.01); *H01L 33/52* (2013.01); *H01L 33/62* (2013.01); *G09F 9/301* (2013.01); *G09G 2380/02* (2013.01); *H01L 51/0097* (2013.01); *H01L 2251/5338* (2013.01); *H01L 2933/005* (2013.01); *H01L 2933/0066* (2013.01)

(58) Field of Classification Search
CPC ......... H01L 33/42; H01L 33/52; H01L 33/56; H01L 33/58; H01L 51/0097; H01L 2251/5338; G09G 2380/02; G09F 9/301
See application file for complete search history.

(56) References Cited

U.S. PATENT DOCUMENTS

| | | | | |
|---|---|---|---|---|
| 8,754,434 | B1 * | 6/2014 | Gollier | H01L 51/5268 257/98 |
| 9,939,920 | B2 * | 4/2018 | Demenschonok | G06F 3/021 |
| 2004/0234766 | A1 * | 11/2004 | Liu | C04B 26/04 428/403 |
| 2005/0179668 | A1 * | 8/2005 | Edwards | G06F 3/0362 345/173 |
| 2010/0258346 | A1 * | 10/2010 | Chen | H01L 21/56 174/521 |

(Continued)

FOREIGN PATENT DOCUMENTS

TW 201503424 1/2015

OTHER PUBLICATIONS

Chen et al., English Translated of TW Publication No. 201503424, Jan. 16, 2018; (Machine Translated Sep. 28, 2018).*

*Primary Examiner* — Mohsen Ahmadi
(74) *Attorney, Agent, or Firm* — ScienBiziP, P.C.

(57) ABSTRACT

The present invention relates to a flexible light source structure. The flexible light source structure includes a flexible insulating layer, a conductive trace layer formed on the flexible insulating layer, a plurality of light emitting diodes formed on the conductive trace layer and a packaging layer. The packaging layer covers the light emitting diodes and filling the gaps between the light emitting diodes.

19 Claims, 4 Drawing Sheets

(56) References Cited

U.S. PATENT DOCUMENTS

| | | | | |
|---|---|---|---|---|
| 2011/0315956 | A1* | 12/2011 | Tischler | H01L 23/4985 257/13 |
| 2014/0008657 | A1* | 1/2014 | Lu | H01L 33/16 257/59 |
| 2014/0276247 | A1* | 9/2014 | Hall | A61N 1/0432 601/2 |
| 2016/0041663 | A1* | 2/2016 | Chen | G06F 3/0412 345/174 |
| 2016/0154515 | A1* | 6/2016 | Mu | G06F 3/0412 345/174 |
| 2016/0163765 | A1* | 6/2016 | Hu | H01L 27/156 257/93 |
| 2017/0086291 | A1* | 3/2017 | Cotton | H01L 23/5387 |
| 2017/0179087 | A1* | 6/2017 | Kang | H01L 25/0753 |
| 2017/0256692 | A1* | 9/2017 | Van Bommel | H01L 51/0097 |
| 2017/0294495 | A1* | 10/2017 | Shyu | G06F 3/041 |
| 2018/0040850 | A1* | 2/2018 | Huang | H01L 51/52 |

\* cited by examiner

FLEXIBLE LIGHT SOURCE STRUCTURE AND METHOD FOR MANUFACTURING SAME

FIELD

The subject matter herein generally relates to a light source, especially, to a flexible light source structure and its manufacturing method.

BACKGROUND

With the development of optoelectronic technology, the application of LED light source becomes more and more extensive, such as indicator light box, lighting panel, backlight module, advertising light board and so on. However, the light source module used in these products are not flexible. The above-mentioned disadvantages need to be overcome.

BRIEF DESCRIPTION OF THE DRAWINGS

Implementations of the present technology will now be described, by way of example only, with reference to the attached figures.

DETAILED DESCRIPTION

Figure 1:
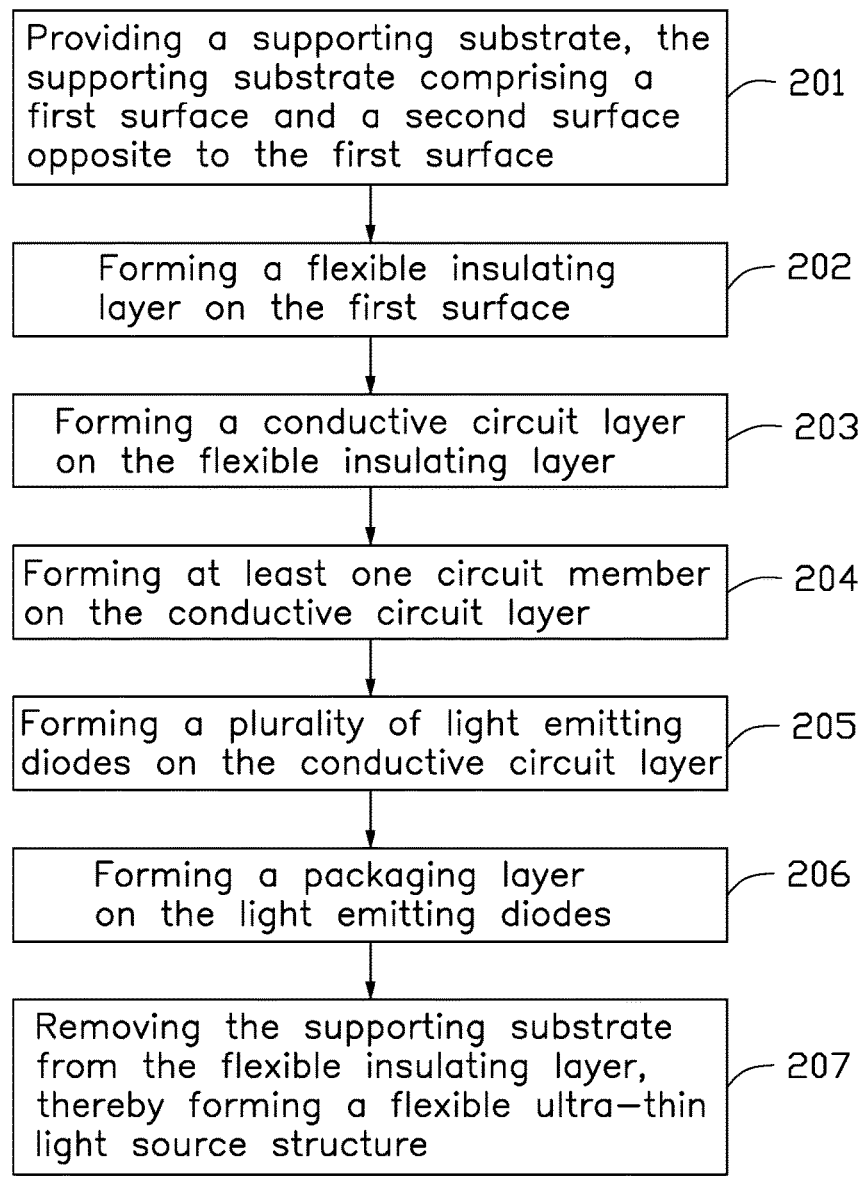
FIG. 1 is a flowchart of a manufacturing method for a flexible light source structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

FIG. 1 illustrates a method 200 for manufacturing a flexible light source structure 100 (shown in FIG. 7) according to one embodiment. The method is provided by way of example as there are a variety of ways to carry out the method. The method 200 can begin at Block 201.

Figure 2:
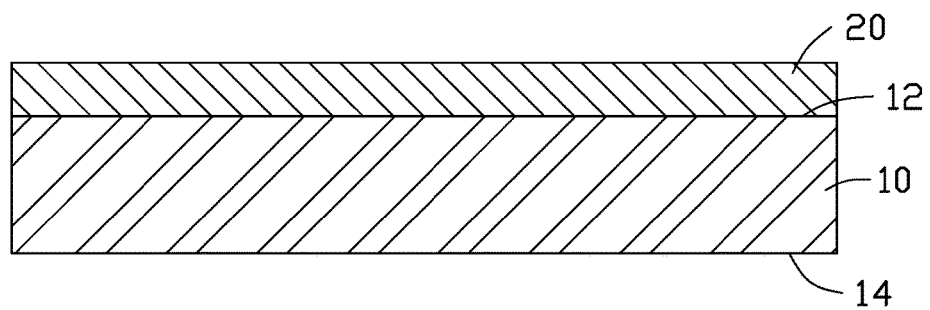
FIGS. 2-6 are cross-sectional views of a flexible light source structure formed in accordance with one exemplary embodiment.

FIG. 2 provides a cross-sectional view of forming the flexible light source structure in accordance with Block 201 depicted in FIG. 1. A supporting substrate 10 is provided. The supporting substrate 10 includes a first surface 12 and a second surface 14 opposite to the first surface 12. In the illustrated embodiment, the supporting substrate 10 is a glass substrate or a ceramic substrate.

The supporting substrate 10 is used as a mechanical support for the structure formed in the subsequent steps. The supporting substrate 10 can be transparent or opaque, since the supporting substrate 10 does not form as a part of the flexible light source structure 100, the supporting substrate 10 may be made from a relatively low cost material. For example, the supporting substrate 10 may use plain glass rather than chemically strengthened glass, to reduce the production cost of the flexible light source structure 100.

In addition, the supporting substrate 10 can be recycled after removal from the flexible light source structure 100, thus further reducing the manufacturing cost. Of course, the supporting substrate 10 is not limited to glass; it may be any other suitable material for mechanical support.

A flexible insulating layer 20 is formed on the first surface 12 of the supporting substrate 10. The flexible insulating layer 20 is formed on the supporting substrate 10 via coating, printing or mold pressing method. A thickness of the flexible insulating layer 20 is in a range from 5 to 50 microns. And the thermal expansion coefficient of the flexible insulating layer 20 is close to the thermal expansion coefficient of the supporting substrate 10.

In the illustrated embodiment, the flexible insulating layer 20 is formed via a coating method. The supporting substrate 10 is placed on a movable platform, and a solution is coated on the supporting substrate 10 by a coating knife head or a coating machine, and the coating layer is baked at high temperature to solidify the coating layer, a polyimide film is formed by volatilizing some solvents and/or by polymerizing some components in the solution (e.g., polymeric monomer or precursor). Then, the flexible insulating layer 20 is formed.

A material of the flexible insulating layer 20 can be polyimide polyimide (PI), polyethylene terephthalate (PET), polycarbonate (PC), polyethersulfone (PES) or poly methyl methacrylate (PMMA). In the illustrated embodiment, the flexible insulating layer 20 is polyimide and withstand a high temperature, this prevent the flexible insulating layer 20 from warping during the curing process. Here the high temperature is about 400 degrees Celsius.

Figure 3:
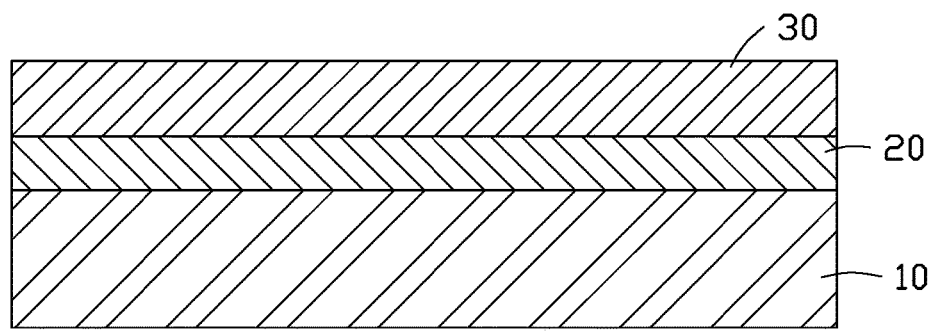

FIG. 3 provides a cross-sectional view of forming the flexible light source structure in accordance with Block 203 depicted in FIG. 1. A conductive circuit layer 30 is formed on the flexible insulating layer 20. A thickness of the conductive circuit layer 30 is in a range from 1 micron to 50 microns. The conductive circuit layer 30 may be a single layer or multiple layers. The conductive circuit layer 30 is formed on the flexible insulating layer 20 by vacuum sputtering, or electroplating. A material of the conductive circuit layer 30 can be silver, nickel, copper, tin, aluminum or alloys any combination thereof. The conductive circuit layer 30 can also be made from indium tin oxide (ITO), indium zinc oxide (IZO), Indium gallium oxide (IGO), indium tungsten oxide (IWOO) and other transparent conductive materials.

Figure 4:
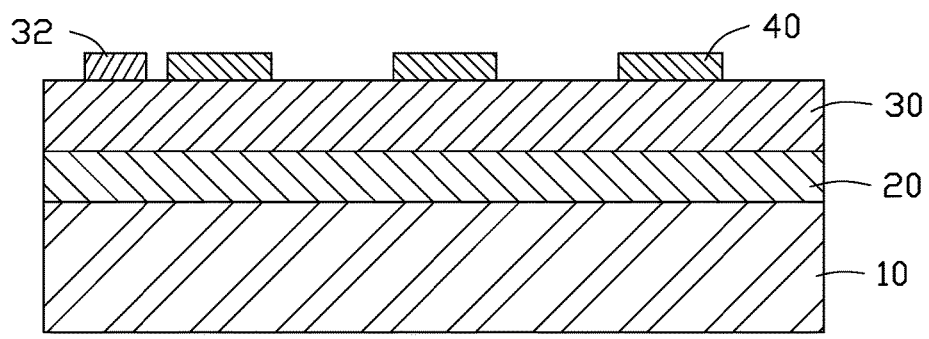

FIG. 4 provides a cross-sectional view of forming the flexible light source structure in accordance with Block 204 depicted in FIG. 1. At least one circuit member 32 is formed on the conductive circuit layer 30. The circuit member 32 is formed by a low temperature polysilicon technology (LTPS). The circuit member 32 can be a driving member for driving light emitting diodes 40 described below to emit light. The circuit member 32 can also be a control member to control time-domain or frequency-mode of the light emitting diodes 40, thus controlling current of the light emitting diodes 40.

The circuit member 32 is formed by a low temperature poly-silicon technology, thus, the thickness of the circuit member 32 is controllable, and the size of the circuit element 32 is reduced as compared to a circuit member that is mounted directly on the conductive circuit layer 30. The overall thickness of the flexible light source structure 100 is reduced.

At Block 205, as shown in FIG. 4, a plurality of light emitting diodes 40 are formed on the conductive circuit layer 30. Area of each light emitting diode 40 is about $2.5 \times 10^4$ um$^2$. An electrical connection between the light emitting diodes 40 and the conductive circuit layer 30 includes but is not limited to lead bonding and reverse mounting welding. The reflow welding process is carried out at 220° C.~320° C. In order to prevent the flexible insulating layer 20 from warping from the supporting substrate 10 during reflux welding, the thermal expansion coefficient of the flexible insulating layer 20 is closer or equal to the thermal expansion coefficient of the supporting substrate 10. The light emitting diodes 40 also can be formed on the conductive circuit layer 30 using a metal organic chemical vapor deposition method.

Figure 5:
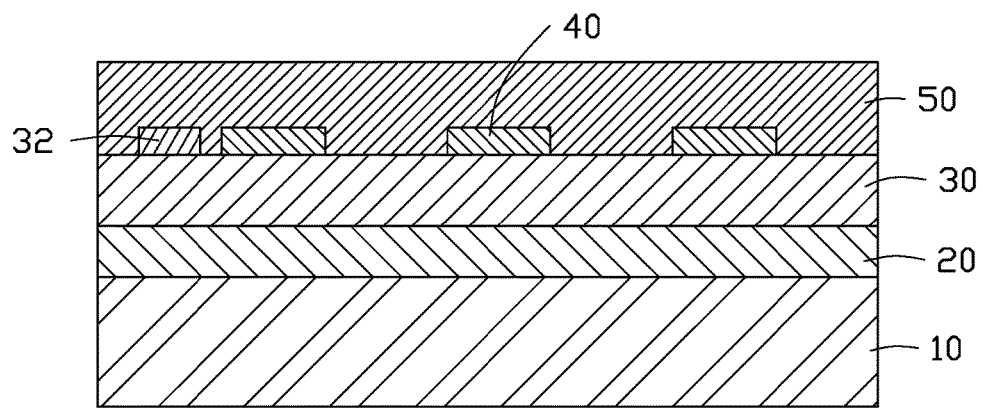

FIG. 5 provides a cross-sectional view of forming the flexible light source structure in accordance with Block 206 depicted in FIG. 1. At Block 206, as shown in FIG. 5, a packaging layer 50 is formed on the light emitting diodes 40. The packaging layer 50 covers the circuit member 32, the light emitting diodes 40 and filling the gaps between the light emitting diodes 40 and gaps between the circuit member 32 and the light emitting diodes 40. A thickness of the packaging layer 50 is in a range from 1 micron to 500 microns.

The packaging layer 50 ensures light emitted out from the light emitting diodes 40 and effectively insulates moisture and protect the light emitting diodes 40. A thermal expansion coefficient of the packaging layer 50 is closer or equivalent to that of the flexible insulating layer 20, to prevent the flexible insulating layer 20 from warping from the packaging layer 50. A material of the packaging layer 50 is silicone or epoxy. In the illustrated embodiment, the packaging layer 50 is polyethylene terephthalate (PET). The package layer 50 is formed by transfer molding or injection molding.

Figure 6:
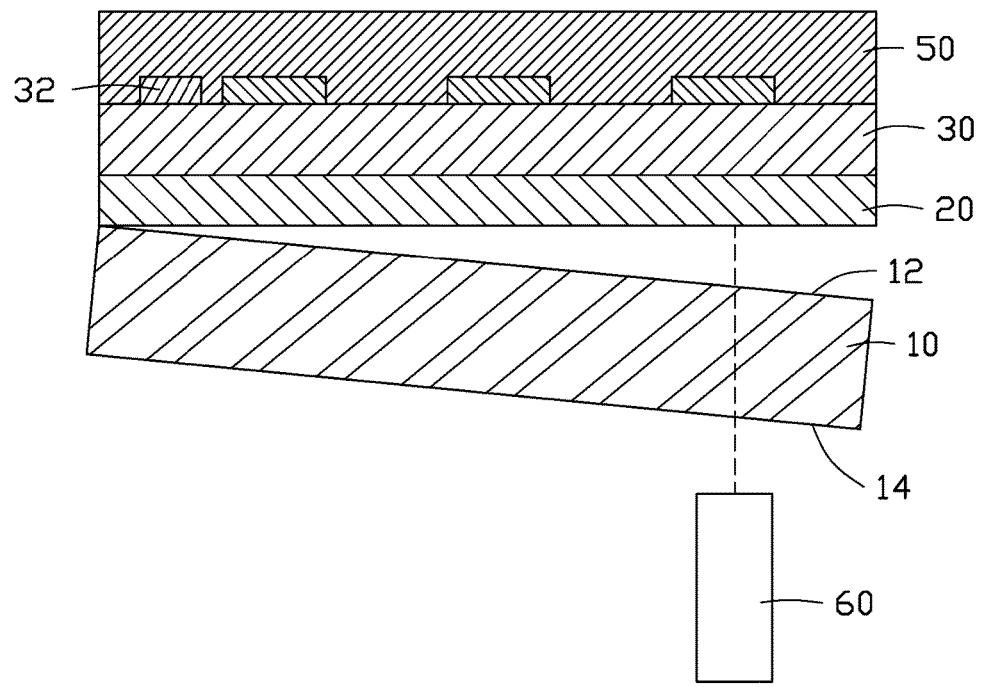
Figure 7:
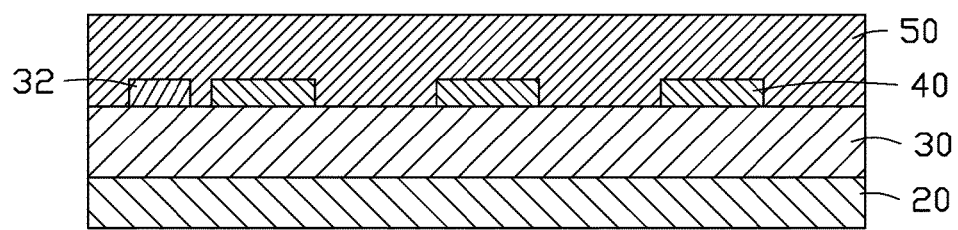
FIG. 7 is a cross sectional view of a flexible light source structure formed in accordance with the present disclosure.

At Block 207, as shown in FIGS. 6-7, the supporting substrate 10 is removed from the flexible insulating layer 20, and the flexible light source structure 100 is obtained.

When the package layer 50 is solidified, the supporting substrate 10 is removed by bending, etching, laser cutting or grinding. In this embodiment, the lower surface 14 of the supporting substrate 10 is scanned using a beam emitted by the laser light source 60 to remove the supporting substrate 10, as shown in FIG. 7. Since the flexible insulating layer 20 is formed by coating a polymer material on the first surface of the supporting substrate 10, and the conductive line layer 30 is formed by splashing, vapor deposition or electroplating. Thus, a thickness of the flexible insulating layer 20 and the conductive circuit layer 30 can be controlled, and thus, the thickness of the flexible light source structure 100 can be controlled.

Since both the flexible insulating layer 20 and the packaging layer 50 can transmit light, the flexible light source structure 100 is a double-sided luminous structure. The overall thickness of the flexible light source structure 100 is in a range from 7 microns to 600 microns, so the flexible light source structure 100 can meet the needs of thinning and flexure. The flexible light source structure 100 can be used in indicator light box, lighting panel, backlight module, advertising light board and other devices.

FIG. 7 illustrates a flexible light source structure 100 according to one embodiment. The flexible light source structure 100 includes a flexible insulating layer 20, a conductive trace layer 30 formed on the flexible insulating layer 20, a plurality of light emitting diodes 40 formed on the conductive trace layer 30 and a packaging layer 50. The flexible light source structure 100 further includes a circuit member 32. The packaging layer 50 covers the circuit member 32, the light emitting diodes 40 and filling the gaps between the light emitting diodes 40 and gaps between the circuit member 32 and the light emitting diodes 40.

The flexible insulating layer 20 and the package layer 50 are transparent, and the conductive trace layer 30 forms on portion of the flexible insulating layer 20, thus, the flexible light source structure 100 is a double-sided luminous structure.

A thickness of the flexible insulating layer 20 is in a range from 5 microns to 50 microns. A thickness of the conductive circuit layer 30 is in a range from 1 micron to 50 microns. A thickness of the packaging layer 50 is in a range from 1 micron to 500 microns. The overall thickness of the flexible light source structure 100 is between 7 microns and 600 microns, and the light source structure is flexible and a ultra-thin light source structure.

A thermal expansion coefficient of the packaging layer 50 is equal to a thermal expansion coefficient of the flexible insulating layer 20, a warping of the flexible insulating layer 20 from the packaging layer 50 is avoid.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing flexible light source structure comprising:
    providing a supporting substrate, the supporting substrate comprising a first surface and a second surface opposite to the first surface;
    forming a flexible insulating layer on the first surface;
    forming a conductive circuit layer on the flexible insulating layer;
    forming a plurality of light emitting diodes on the conductive circuit layer;

forming at least one circuit member on the conductive circuit layer beside one of the light emitting diodes, the at least one circuit member being a driving member for driving light emitting diodes to emit light or a control member to control time-domain or frequency-mode of the light emitting diodes;

forming a packaging layer on the light emitting diodes and the circuit member and filling gaps between the light emitting diodes and gaps between the light emitting diodes and the circuit member; and removing the supporting substrate from the flexible insulating layer, thereby forming the flexible light source structure.

2. The method of claim 1, wherein the circuit member is formed by a low temperature polysilicon technology.

3. The method of claim 1, wherein the conductive circuit layer is formed on the flexible insulating layer by vacuum sputtering or electroplating.

4. The method of claim 3, wherein a thickness of the conductive circuit layer is in a range from 1 micron to 50 microns.

5. The method of claim 1, wherein a material of the conductive circuit layer is selected from a group consisting of silver, nickel, copper, tin, aluminum, or alloys.

6. The method of claim 1, wherein the conductive circuit layer is made from indium tin oxide (ITO), indium zinc oxide (IZO), Indium gallium oxide (IGO), or indium tungsten oxide (IWOO).

7. The method of claim 1, wherein the flexible insulating layer is formed on the on the first surface of the supporting substrate by coating, printing or mold pressing method, and the flexible insulating layer is transparent.

8. The method of claim 1, wherein a material of the flexible insulating layer is polyimide polyimide (PI), polyethylene terephthalate (PET), polycarbonate (PC), polyethersulfone (PES) or poly methyl methacrylate (PMMA).

9. The method of claim 1, wherein a thickness of the flexible insulating layer is in a range from 5 microns to 50 microns.

10. The method of claim 1, wherein a thermal expansion coefficient of the packaging layer is equal to a thermal expansion coefficient of the flexible insulating layer.

11. The method of claim 1, wherein a thickness of the packaging layer is in a range from 1 micron to 500 microns.

12. The method of claim 1, wherein the flexible insulating layer and the package layer are transparent.

13. A flexible light source structure comprising:
a flexible insulating layer;
a conductive circuit layer formed on the flexible insulating layer;
a plurality of light emitting diodes formed on the conductive circuit layer;
at least one circuit member formed on the conductive circuit layer and beside one of the light emitting diodes, the at least one circuit member being a driving member for driving light emitting diodes to emit light or a control member to control time-domain or frequency-mode of the light emitting diodes; and
a packaging layer, the packaging layer covers the light emitting diodes, the circuit member and filling gaps between the light emitting diodes and gaps between the light emitting diodes and the circuit member.

14. The flexible light source structure of claim 13, wherein the flexible insulating layer is transparent.

15. The flexible light source structure of claim 13, wherein a thermal expansion coefficient of the packaging layer is equal to a thermal expansion coefficient of the flexible insulating layer.

16. The flexible light source structure of claim 13, wherein a thickness of the packaging layer is in a range from 1 micron to 500 microns.

17. The flexible light source structure of claim 13, wherein a thickness of the flexible insulating layer is in a range from 5 microns to 50 microns.

18. The flexible light source structure of claim 13, wherein the flexible insulating layer and the package layer are transparent.

19. The flexible light source structure of claim 13, wherein an overall thickness of the flexible light source structure is between 7 microns and 600 microns.

* * * * *